United States Patent
Tanaka

[11] Patent Number: 6,025,669
[45] Date of Patent: Feb. 15, 2000

[54] PIEZOELECTRIC RESONATOR AND PIEZOELECTRIC COMPONENTS USING THE SAME

[75] Inventor: Yasuhiro Tanaka, Nagaokakyo, Japan

[73] Assignee: Murata Manufacturing Co., Ltd., Japan

[21] Appl. No.: 09/034,118

[22] Filed: Mar. 3, 1998

Related U.S. Application Data

[63] Continuation of application No. 08/674,243, Jul. 1, 1996.

[51] Int. Cl.[7] .................................... H01L 41/08
[52] U.S. Cl. ............................ 310/364; 310/355
[58] Field of Search ................... 310/363, 364, 310/354, 355

[56] References Cited

U.S. PATENT DOCUMENTS

| | | | |
|---|---|---|---|
| 2,095,376 | 10/1937 | Bechmann | 310/364 |
| 2,124,596 | 7/1938 | Sykes | 310/355 |
| 3,317,762 | 5/1967 | Corwin et al. | 310/364 X |
| 3,679,919 | 7/1972 | Ichinose et al. | 310/355 |
| 4,382,203 | 5/1983 | Tribby et al. | 310/355 |
| 4,684,843 | 8/1987 | Ohya et al. | 310/355 |

*Primary Examiner*—Mark O. Budd
*Attorney, Agent, or Firm*—Ostrolenk, Faber, Gerb & Soffen, LLP

[57] ABSTRACT

A piezoelectric resonator which can be used as part of a piezoelectric component prevents self-welding of electrodes provided on the surface of a piezoelectric and which include silver with silver coated terminals with which the electrodes abut by forming high fusion point metals on the electrodes. The high fusion point metals include Ni, Cr, W, Ti, Mo, Ni—Cu (monel) or their alloy. The thickness of the high fusion point metal is preferably less than about 1/10 of the thickness of the electrode or less than 1 $\mu$m.

16 Claims, 2 Drawing Sheets

6,025,669

PIEZOELECTRIC RESONATOR AND PIEZOELECTRIC COMPONENTS USING THE SAME

RELATED APPLICATION

This is a continuing application of application Ser. No. 08/674,243, filed Jul. 1, 1996, claiming priority of Japanese Patent Application Nos. 7-166449 and 7-166451, both filed Jun. 30, 1995.

BACKGROUND OF THE INVENTION

1. Field of the Invention

The present invention relates to a piezoelectric resonator and more particularly to a piezoelectric resonator for use in an oscillation circuit, a filter circuit or the like and a piezoelectric component using such a piezoelectric resonator.

2. Description of Related Art

It is well-known to form piezoelectric components in which a piezoelectric resonator is held in place by metal terminals which contact opposite surfaces of the piezoelectric resonator. The piezoelectric resonator includes a piezoelectric substrate having a electrodes formed on its opposing surfaces. The electrodes are normally made from silver. The metal terminals are typically made from a metal plate member, for example a phosphor bronze member, which is coated with silver to improve the electrical contact with the electrodes and lead electrodes.

While silver is advantageous for its excellent conducting characteristics, it has a tendency to self-weld. As a result, welding may occur at positions where the silver coated metal terminals contact the electrodes. If this occurs, the electrodes may be peeled off of the piezoelectric substrate when the piezoelectric substrate vibrates, thus causing inferior electrical conduction between the electrodes and the metal terminals.

Accordingly, it is an object of the present invention to provide a piezoelectric resonator and a piezoelectric component using such a piezoelectric resonator in which the likelihood that the electrodes provided on the surfaces of a piezoelectric substrate will weld with metal terminals whose surface is coated with a silver film is significantly reduced.

SUMMARY OF THE INVENTION

In order to achieve the aforementioned goal, an inventive piezoelectric resonator comprises:

a piezoelectric substrate;

an electrode including silver provided on a surface of said piezoelectric substrate, said electrode having a contact surface adapted to be contacted by a terminal; and high fusion point metal provided on said contact surface of said electrode.

The high fusion point metal is preferably a high fusion point metal film or a high fusion point fine particle. The high fusion point metal is provided either on the entirety of the contact surface of the electrode or only on the portion of the electrode which is in contact with a silver coated terminal.

In the preferred embodiment, the piezoelectric resonator, comprises:

a piezoelectric substrate having first and second opposed surfaces;

first and second electrodes including silver provided on said first and second opposed surfaces, respectively, said electrodes each having a contact surface adapted to be contacted by a respective terminal; and first and second high fusion point metals provided on said contact surface of said first and second electrodes, respectively.

Again, the high fusion point metal is preferably a high fusion point metal film or high fusion point particles. The high fusion point metal can be formed on the entire surface of the electrodes or only on the portions which are in contact with the terminals.

The piezoelectric resonator of the present invention can be used in a piezoelectric component in which one or more terminals support the piezoelectric resonator and are in contact with the contact surfaces of the electrodes. The piezoelectric resonator and the terminals are preferably housed in a housing to form a unitary component.

Because the electrode provided on the surface of the piezoelectric substrate contacts the silver film of the metal terminal via the high fusion point metal film, the electrode will not directly contact the silver film, thereby avoiding self-welding of the silver film.

Further, because the electrode provided on the surface of the piezoelectric substrate contacts the silver film of the metal terminal through the intermediary of the high fusion point fine particles, the area where the electrode contacts directly with the silver film is reduced, thus suppressing the self-welding of the silver.

The specific nature of the invention, as well as other objects, uses and advantages thereof, will clearly appear from the description and from the accompanying drawings in which like numerals refer to like or corresponding components.

BRIEF DESCRIPTION OF DRAWINGS

For the purpose of illustrating the invention, there is shown in the drawing several forms which are presently preferred, it being understood, however, that the invention is not limited to the precise arrangements and instrumentalities shown.

DESCRIPTION OF PREFERRED EMBODIMENTS

Figure 1:
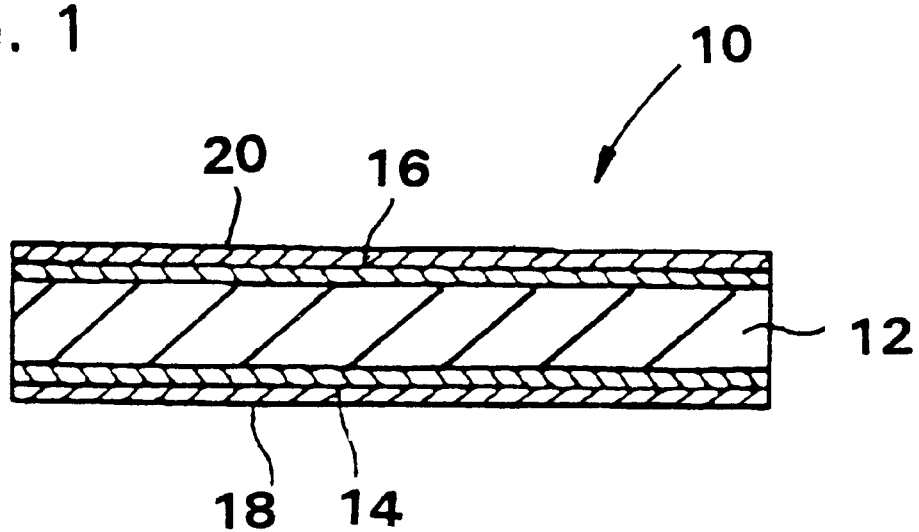
FIG. 1 is a section view showing one preferred embodiment of a piezoelectric resonator constructed in accordance with the principles of the present invention.

Referring now to the drawings wherein like numerals indicate like elements, there is shown in FIG. 1 a piezoelectric resonator constructed in accordance with the principles of the present invention and designated generally as 10. Piezoelectric resonator 10 comprises a piezoelectric substrate 12, a pair of electrodes 14, 16 provided on opposite main surfaces of the piezoelectric substrate 12 (and preferably covering the entirety of the main surfaces) and high fusion point metal films 18, 20 provided on the surface of the electrodes 14, 16, respectively. The piezoelectric substrate 12 is preferably made from a ceramic material such as PZT, quartz, a mono-crystal of LiTaO$_3$ or the like. The electrodes 14, 16 are formed by means of silver sputtering, evaporation, print drying or any other suitable process.

The high fusion point metal films 18, 20 are made from a metal having a higher fusion point than that of the electrodes 14, 16, such as Ni, Cr, W, Ti, Mo, Ni—Cu (monel) and their alloys, and is preferably formed on the electrodes 14, 16 by means of sputtering, evaporation or print drying. The thickness of the metal films 18, 20 is set at a value which will not impair the characteristic of the electrodes 14, 16. It is preferable to select a value which is less than about 1/10 of the thickness of the electrodes 14, 16 or less than 1 μm, whichever is smaller (for example, in case of Ni—Cu, it is preferable to be about 0.2 μm).

Figure 2:
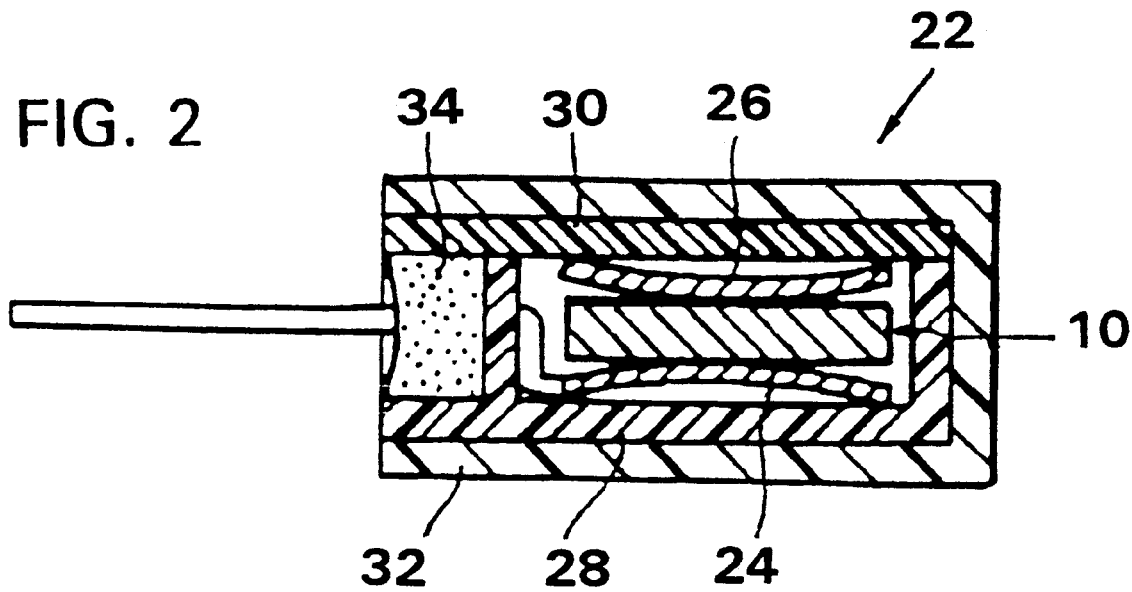
FIG. 2 is a section view showing a piezoelectric component using the piezoelectric resonator shown in FIG. 1.

FIG. 2 shows a resonator device 22 employing the piezoelectric resonator 10 of FIG. 1. In the resonator device 22, which preferably operates in a KHz band, the piezoelectric resonator 10 is held in place by a pair of metal terminals 24, 26 which are housed in an inner case 28. An opening is formed in the top of inner case 28 to permit the piezoelectric resonator 10 and the terminals 24, 28 to be placed inside the case 28. This opening is closed by an inner cover 30 after the piezoelectric resonator 10 and the terminals 24, 26 have been placed within the case. The inner case 28 is then inserted into an outer case 32 which is sealed by a sealing resin 34.

The piezoelectric resonator 10 is held between the metal terminals 24 and 26 which contact the two main surfaces of the resonator 10 at the middle portion thereof and vibrates in a divergent vibration mode. The metal terminals 24 and 26 are preferably created by coating a silver film on the surface of a plate member formed of phosphor bronze or the like by means of plating or other suitable process. The metal terminals 24 and 26 have an elasticity and are elastically in contact with the piezoelectric resonator 10.

Because the electrodes 14, 16 of the piezoelectric resonator 10 elastically contact the metal terminals 24 and 26 via the high fusion point metal films 18, 20, the silver of the electrodes 14, 16 and that of the metal terminals 24, 26 will not self-weld and the likelihood that component of the electrodes 14, 16 will peel off of the piezoelectric substrate 12 when the piezoelectric resonator 10 resonates is significantly reduced.

While a preferred embodiment has been described, the piezoelectric resonator of the present invention and the piezoelectric component of the present invention are not limited to this embodiment. Rather, they may be modified in various ways within the scope of the spirit of the present invention.

In the foregoing embodiment, a discrete piezoelectric resonator and a discrete piezoelectric component have been disclosed. However, the invention utilizing the high fusion point metal film may be applied to mass produced piezoelectric resonators such as those formed on a mother board.

Further, it is not always necessary to form the high fusion point metal film on the entire surface of the electrodes of the piezoelectric substrate. Rather, it may be formed locally at the locations where the metal terminals contact the surfaces of the piezoelectric substrate.

Figure 3:
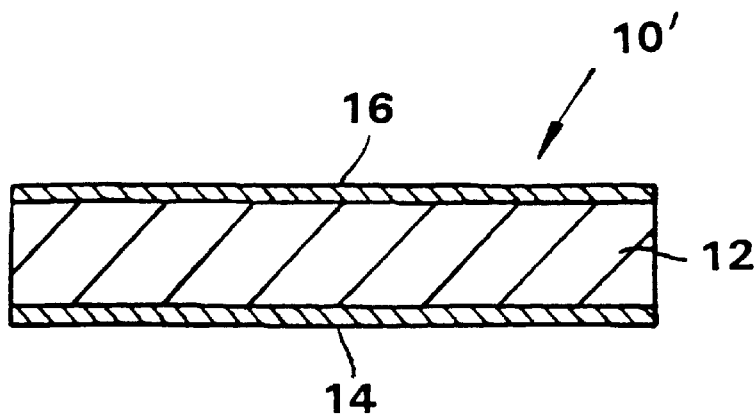
FIG. 3 is a section view showing another embodiment of a piezoelectric resonator constructed in accordance with the principles of the present invention.
Figure 4:
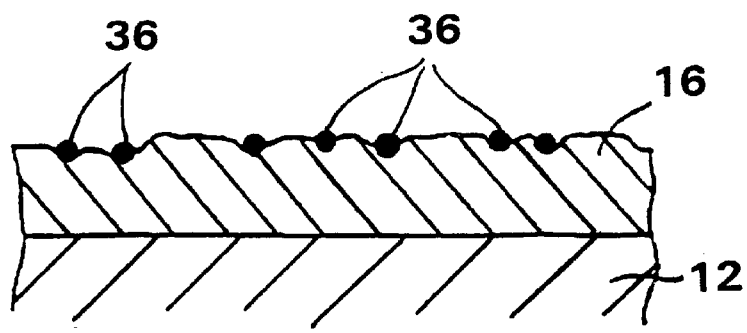
FIG. 4 is a partially enlarged section view of an electrode of the piezoelectric resonator shown in FIG. 3.

FIGS. 3 and 4 show a second embodiment of the piezoelectric resonator of the present invention. To distinguish this embodiment from FIG. 1, the piezoelectric resonator has been designated as 10'. Like the first embodiment, the piezoelectric resonator 10 comprises a piezoelectric substrate 12 having a pair of electrodes 14, 16 provided on the opposing main surfaces of the piezoelectric substrate 12. Preferably, the electrodes 14, 16 cover the entire top and bottom surfaces of the substrate 12. While the first embodiment used a high fusion point film to prevent self welding of the electrodes, in this embodiment, high fusion point fine particles 36 are adhered to the surface of the electrodes 14, 16. The piezoelectric substrate 12 is preferably made from ceramic material such as PZT, quartz, a mono-crystal of LiTaO$_3$ or the like. The electrodes 14, 16 are preferably formed by means of Silver sputtering, evaporation, print drying or the like.

The high fusion point fine particles 36 are made from a material having a higher fusion point than that of the electrodes 14, 16, such as ceramics and glass of alumina or the like or Ni, Cr, W, Ti, Mo, Ni—Cu (monel) or their alloys. The high fusion point fine particles 38 are preferably either adhered to the surface of the electrodes 14, 16 or embedded in the electrodes 14, 16 by blowing them on the surface of the electrode by, for example, sand blasting. Alternatively, the high fusion point fine particles 36 are adhered on the surface of the electrodes 14, 16 or embedded in the electrodes 14, 16 by means of agitation by placing the fine particles 36 and the piezoelectric resonator 10 in the same container and by stirring them. Since the electrodes 14, 16 are formed of silver which is a relatively soft material, the fine particles 36 can also be embedded in the electrodes 14, 16 by means of sand blasting or agitation. When the fine particles 36 are embedded in the electrodes 14, 16, the electrical connection between the electrodes 14, 16 and the metal terminals described below will not degrade even if the insulating fine particles 36 are used and no particles fall off from the electrodes 14, 16. Preferably, the high fusion point fine particles 36 are embedded in the electrodes 14, 16 with a density which will not impair the characteristics of the electrodes 14, 16.

Further, the surface of the electrodes 14, 16 may be smoothed as necessary by removing extra fine particles 36 so that the fine particles 36 are disposed at concaved portions of the electrodes 14, 16 by cleaning or mechanically rubbing the electrodes 14, 16 on which the high fusion point fine particles 36 are adhered by means of sand blasting or agitation or by shaking off them by applying vibration. It is noted that the size and shape of the fine particles 36 are arbitrary and may be modified in various way depending on the requirements of a specific application.

Figure 5:
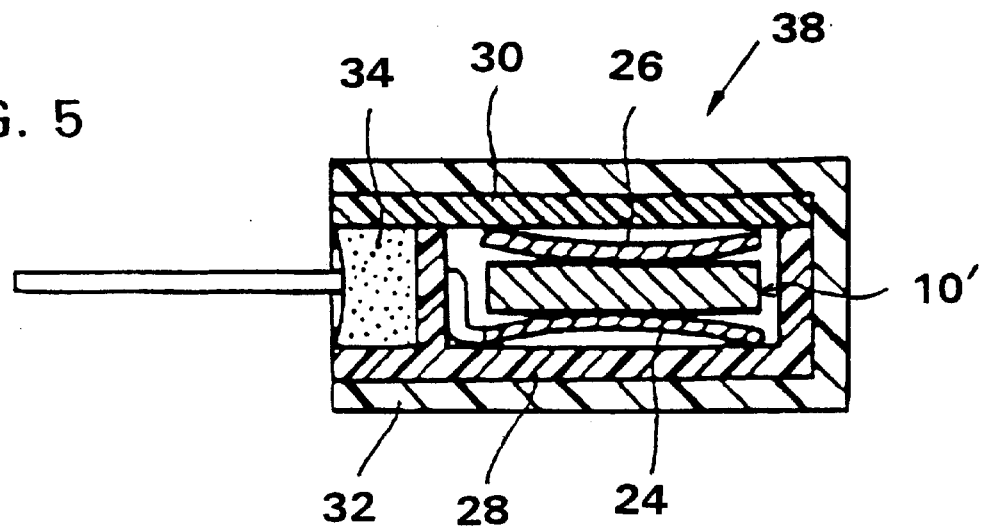
FIG. 5 is a section view showing a piezoelectric component using the piezoelectric resonator shown in FIG. 3.

FIG. 5 shows a resonator device 38 employing the piezoelectric resonator 10 of FIG. 3. In the resonator device 38, which preferably operates in a KHz band, the piezoelectric resonator 10 is held in place by a pair of metal terminals 24, 26 which are housed in the inner case 28. An opening is formed in the top of inner case 28 to permit the piezoelectric resonator 10 and the terminals 24, 28 to be placed inside the case 28. This opening is then closed by the inner cover 30 after the piezoelectric resonator 10' and the terminals 24, 26 have been placed within the case. The inner case 28 is then inserted into an outer case 32 which is sealed by a sealing resin 34. The piezoelectric resonator 10' is held by the metal terminals 24 and 26 at the middle portion of the two main surfaces thereof and vibrates in a divergent vibration mode. The metal terminals 24 and 26 are preferably created by coating a silver film on the surface of a plate member formed of phosphor bronze or the like by means of plating or other suitable process. The metal terminals 24 and 26 have an elasticity and are elastically in contact with the piezoelectric resonator 10.

Because the electrodes 14, 16 of the piezoelectric resonator 10 contact the metal terminals 24 and 26 through the intermediary of the high fusion point fine particles 36 and area where the electrodes 14, 16 directly contact with the metal terminals 24 and 26 is small, the silver of the electrodes 14, 16 and that of the metal terminals 24 and 26 will not self-weld (or at least the self-welding will be minimized) the likelihood that component of the electrodes 14, 16 will be peeled off of the piezoelectric substrate 12 when the piezoelectric resonator 10 resonates is significantly reduced.

While a preferred embodiment has been described, the piezoelectric resonator of the present invention and the piezoelectric components of the present invention are not limited to this embodiment. Rather, they may be modified in various ways within the scope of the spirit of the present invention. For example, it is not always necessary for the high fusion point fine particles to be adhered on the entire surface of the electrodes of the piezoelectric substrate 12. Rather, they may be adhered locally at the components where the metal terminals 24, 26 contact the piezoelectric resonator 10 or the piezoelectric resonator 10'.

As is apparent from the above description, the present invention provides a high fusion point metal on the surface of the electrode of the piezoelectric resonator so that there is no direct contact of the electrode with the silver film and self-welding of the silver is provided. As a result, the problem that component of the electrode may be peeled off from the piezoelectric substrate is avoided, thereby improving the reliability of electrical connection between the electrode and the metal terminal.

The present invention may be embodied in other specific forms without departing from the spirit or essential attributes thereof and, accordingly, reference should be made to the appended claims, rather than to the foregoing specification, as indicating the scope of the invention.

What is claimed is:

1. A piezoelectric component, comprising:
   a generally planar piezoelectric substrate;
   an electrode including silver provided on a surface of said piezoelectric substrate;
   a high fusion point metal provided on said electrode said metal being selected from the group consisting of Ni, W, Ti, Mo, Ni—Cu and alloys thereof; and
   a metal terminal, whose surface is coated with a silver film, in contact with said high fusion point metal.

2. The piezoelectric component according to claim 1, further including a housing for housing said piezoelectric substrate and said metal terminal.

3. The piezoelectric component according to claim 1, wherein said high fusion point metal is a high fusion point metal film provided on the surfaces of said electrode.

4. The piezoelectric component according to claim 3, wherein said high fusion point metal film is provided on the entire exposed surface of said electrode.

5. The piezoelectric component according to claim 1, wherein said high fusion point metal film is provided on a portion of said surface of said electrode which is in contact with said metal terminal.

6. The piezoelectric component according to claim 1, wherein said high fusion point metal comprises high fusion point fine particles provided on said surface of said electrode.

7. The piezoelectric component according to claim 6, wherein said high fusion point fine particles are provided on the entire exposed surface of said electrode.

8. The piezoelectric component according to claim 6, wherein said high fusion point fine particles are provided on a portion of said surface of said electrode which is in contact with said metal terminal.

9. A piezoelectric component, comprising:
   a generally planar piezoelectric substrate having first and second generally planar opposed surfaces;
   first and second electrodes including silver provided on said first and second surfaces, respectively;
   first and second high fusion point metals provided on said first and second electrodes, respectively, each of said metals being selected from the group consisting of Ni, W, Ti, Mo, Ni—Cu and alloys thereof; and
   first and second metal terminals, each of whose surfaces are coated with a silver film, said first and second metal terminal being in contact with said first and second high fusion point metals, respectively.

10. The piezoelectric component according to claim 9, further including a housing for housing said piezoelectric substrate and said metal terminals.

11. The piezoelectric component according to claim 10, wherein each of said high fusion point metals is a high fusion point metal film.

12. The piezoelectric component according to claim 11, wherein said high fusion point metal films are provided on the entire exposed surface of their respective said electrodes.

13. The piezoelectric component according to claim 11, wherein said high fusion point metal films are each provided on a portion of said surface of said electrode which is in contact with said metal terminal.

14. The piezoelectric component according to claim 9, wherein each of said high fusion point metals comprises high fusion point fine particles.

15. The piezoelectric component according to claim 14, wherein said high fusion point fine particles are provided on the entire exposed surface of said electrodes.

16. The piezoelectric component according to claim 14, wherein said high fusion point fine particles are provided on a portion of said surfaces of said electrodes which are in contact with their respective said metal terminal.

* * * * *